(12) United States Patent
Hsu

(10) Patent No.: US 7,614,146 B2
(45) Date of Patent: Nov. 10, 2009

(54) METHOD FOR FABRICATING CIRCUIT BOARD STRUCTURE

(75) Inventor: Shih-Ping Hsu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 8 days.

(21) Appl. No.: 11/867,660

(22) Filed: Oct. 4, 2007

(65) Prior Publication Data
US 2008/0092379 A1 Apr. 24, 2008

Related U.S. Application Data

(62) Division of application No. 11/867,647, filed on Oct. 4, 2007.

(30) Foreign Application Priority Data
Oct. 19, 2006 (TW) .............................. 95138509 A

(51) Int. Cl.
*H05K 3/42* (2006.01)
(52) U.S. Cl. .............................. 29/852; 29/830; 29/828; 29/847; 29/851; 430/311
(58) Field of Classification Search ................... 29/846, 29/831, 830, 847, 828, 851, 852; 430/311
See application file for complete search history.

(56) References Cited

U.S. PATENT DOCUMENTS 6,512,186 B1 * 1/2003 Nishiwaki et al. ............ 174/261
2006/0029726 A1 * 2/2006 Mok et al. ................. 427/96.1

* cited by examiner

*Primary Examiner*—Derris H Banks
*Assistant Examiner*—Dan D Le
(74) *Attorney, Agent, or Firm*—Sawyer Law Group, P.C.

(57) ABSTRACT

The present invention provides a circuit board structure and a method of fabricating circuit board structure the same, the circuit board structure consisting of a carrier board having a first surface and an opposed second surface, the carrier board being formed with at least one through hole penetrating the first and second surfaces; a conductive pillar formed in the through hole by electroplating; and a first circuit layer and a second circuit layer respectively formed on the first and second surfaces of the carrier board, the first and second circuit layers being electrically connected to the two end portions of the conductive pillar, thereby reducing spacing between adjacent conductive pillars of the carrier board and achieving high density circuit layout.

11 Claims, 10 Drawing Sheets

METHOD FOR FABRICATING CIRCUIT BOARD STRUCTURE

CROSS-REFERENCE TO RELATED APPLICATIONS

Under 35 USC §120, this application is a divisional application and claims the benefit of priority to U.S. patent application Ser. No. 11/867,647, filed Oct. 4, 2007 and Under 35 U.S.C. §119(e), this application also claims the benefit of foreign priority to Taiwanese Patent Application No. 095138509, filed Oct. 19, 2006. All of which is incorporated herein by reference.

BACKGROUND OF THE INVENTION

1. Field of the Invention

The present invention relates generally to a method for fabricating circuit board structure, and more particularly to a circuit board structure with a conductive pillar formed therein by electroplating and electrically connected to circuit layers on surfaces of the circuit board, and method for fabricating the circuit board structure.

2. Description of Related Art

Along with development of the semiconductor package technology, to meet operational demands of microprocessors, chipsets and graphic chips, functions of circuit boards in transmitting chip signal, improving frequency band and controlling impedance must be improved so as to meet development of semiconductor packages with large I/O counts. On the other hand, with R&D effort gradually focused on semiconductor packages of small dimension, multi-function, high speed and high frequency, circuit boards used in semiconductor chip packages are required to have fine pitch and small apertures. The circuit dimension such as line width, circuit space and aspect ratio in current circuit board fabricating process is being reduced.

To increase circuit density of circuit boards used in semiconductor chip packages, a build-up technique is proposed, through which multiple dielectric layers and circuit layers are alternately stacked on a core circuit board and a plated through hole (PTH) is formed penetrating the core circuit board so as to electrically connect the circuits on upper and lower surfaces of the core circuit board. Therein, the fabricating process of the core circuit board is a key factor in influencing the circuit density of the circuit boards.

FIGS. 1A to 1D show a method for fabricating a core circuit board. First, as shown in FIG. 1A, a dielectric layer 100 is provided, which is arranged sandwich-like between thin metal layers 101 made of such as copper foil. A plurality of through holes 102 is formed in the dielectric layer 100. Then, as shown in FIG. 1B, circuit layers 103 are formed on surfaces of the dielectric layer 100 by copper plating and patterning and meanwhile a metal layer is deposited on the walls of the through holes 102. Subsequently, as shown in FIG. 1C, the through holes 102 are filled with a conductive or non-conductive filling material 11 such as dielectric ink or copper-containing conductive paste so as to form plated through holes 102a for electrically connecting the circuit layers 103 on the upper and lower surfaces of the dielectric layer 100. Finally, as shown in FIG. 1D, the superfluous filling material 11 is removed through a buffing process so as to keep flatness of the circuit surface. Thus, a core circuit board 10 is obtained.

FIG. 2 is an upper view of a plated through hole 102a and a circuit layer 103 connected thereto. As shown in FIG. 2, the plated through hole 102a is electrically connected to the circuit layer 103 through an annular metal ring 102b and the inside of the plated through hole 102a is filled with the filling material 11. Taking into account of alignment accuracy, diameter of the annular metal ring 102b is required to be greater than that of the plated through hole 102a, for example, if the diameter of the plated through hole 102a is 200 μm, the diameter of the annular metal ring 102b is required to be 350 μm, which however limits the space for layout of the circuit layer 103 on the core circuit board 10. Moreover, due to great dimension of the annular metal ring 102b, spacing between adjacent plated through holes on the core circuit board is difficult to be reduced, thus preventing high density circuit layout on the core circuit board.

In addition, as the plated through hole 102a is filled with the filling material 11, the final circuit board structure comprises several materials of different coefficients of thermal expansion (CTEs). As a result, delamination can occur in the circuit board structure, thereby adversely affecting reliability of the circuit board structure. Further, as the filling material 11 is easy to absorb moisture, the circuit board quality is also decreased. The through hole filling process and the buffing process also complicate the fabricating process of circuit boards.

Therefore, there is a need to provide a method for fabricating circuit board structure that can overcome the conventional drawbacks such as low density circuit layout, low reliability and quality of circuit boards and complicated fabricating process.

SUMMARY OF THE INVENTION

According to the above drawbacks, an objective of the present invention is to provide a method for fabricating circuit board structure so as to increase circuit density on surface of circuit boards and obtain fine pitch circuit board structure.

Another objective of the present invention is to provide a method for fabricating circuit board structure so as to improve circuit board reliability and quality.

A further objective of the present invention is to provide a method for fabricating circuit board structure so as to decrease complexity of the fabricating process.

In order to attain the above and other objectives, the present invention discloses a fabrication method of a circuit board structure, which comprises: providing a carrier board having a first surface and a second surface opposed to the first surface, the carrier board having at least a through hole penetrating the first and second surfaces; forming a conductive pillar in the through hole of the carrier board by electroplating and forming a metal layer on the first and second surfaces by electroplating; and patterning the metal layer so as to respectively form a first circuit layer and a second circuit layer on the first surface and the second surface of the carrier board and form end portions of the conductive pillar protruding above the first and second surfaces of the carrier board, the first and second circuit layers electrically connecting side peripheries of the end portions of the conductive pillar.

The above method further comprises forming a conductive layer on the first and second surfaces of the carrier board and on surface of the through hole; and forming the conductive pillar and the metal layer on surface of the conductive layer by electroplating.

In the above method for fabricating circuit board structure, the carrier board is one of a dielectric board, a copper clad laminate, a double-layer circuit board and a multi-layer circuit board; width of the circuit of the first and second circuit layers electrically connected to the conductive pillar is not greater than diameter of the through hole.

Another method for fabricating a circuit board structure according to the present invention comprises: providing a carrier board having a first surface and a second surface opposed to the first surface, the carrier board having at least a through hole penetrating the first and second surfaces; forming a conductive pillar in the through hole of the carrier board by electroplating and forming a metal layer on the first and second surfaces by electroplating; thinning the metal layer so as to form a thin metal layer; forming a resist layer on surface of the thin metal layer and forming a plurality of openings in the resist layer so as to expose the thin metal layer, wherein portion of the openings being formed at position corresponding to the two ends of the conductive pillar; respectively forming a first circuit layer and a second circuit layer in the openings of the resist layer on the first and second surfaces of the carrier board by electroplating; and removing the resist layer and the thin metal layer covered by the resist layer so as to form end portions of the conductive pillar protruding above the first and second surfaces of the carrier board and electrically connect the first and second circuit layers to top surface of the end portions of the conductive pillar.

The above method further comprises forming a conductive layer on the first and second surfaces of the carrier board and on surface of the through hole; and forming the conductive pillar and the metal layer on surface of the conductive layer by electroplating, and the step of removing the resist layer further comprises removing the conductive layer covered by the thin metal layer.

In the above method for fabricating circuit board structure, the carrier board is a dielectric board, a copper clad laminate or a circuit board having at least two circuit layers; diameter of the end portions of the conductive pillar is not greater than that of the through hole and width of the circuit of the first and second circuit layers electrically connected to the conductive pillar is equal to the end portions of the conductive pillar.

The present invention further discloses a method for fabricating a circuit board structure, which comprises: providing a carrier board having a first surface and a second surface opposed to the first surface, the carrier board having at least a through hole penetrating the first and second surfaces; forming a conductive pillar in the through hole of the carrier board by electroplating and forming a metal layer on the first and second surfaces by electroplating; removing the metal layer on the first and second surfaces; forming a conductive layer on the first and second surfaces of the carrier board and two ends of the conductive pillar; forming a resist layer on the conductive layer and forming a plurality of openings in the resist layer so as to expose the conductive layer, wherein portion of the openings are formed at position corresponding to the two ends of the conductive pillar; respectively forming a first circuit layer and a second circuit layer in the openings of the resist layer on the first and second surfaces of the carrier board, the first and second circuit layers electrically connected to the conductive layer on the two ends of the conductive pillar; and removing the resist layer and the conductive layer covered by the resist layer.

The above method further comprises forming a conductive layer on the first and second surfaces of the carrier board and on surface of the through hole; and forming the conductive pillar and the metal layer on surface of the conductive layer by electroplating, and the step of removing the metal layer further comprises removing the conductive layer covered by the metal layer.

According to the above method, the present invention further discloses a circuit board structure, which comprises: a carrier board having a first surface and a second surface opposed to the first surface, the carrier board having at least a through hole penetrating the first and second surfaces; a conductive pillar formed in the through hole by electroplating, the two ends of the conductive pillar are flush with surface of the carrier board; a conductive layer formed on surface of the two ends of the conductive pillar; and a first circuit layer and a second circuit layer respectively formed on the first and second surfaces of the carrier board and electrically connected to the conductive layer on the two ends of the conductive pillar.

In the above method for fabricating circuit board structure, the carrier board is a dielectric board, a copper clad laminate or a circuit board having at least two layers; and width of the circuit of the first and second circuit layers electrically connected to the conductive pillar is not greater than diameter of the through hole.

Therefore, according to the present invention, a conductive pillar is formed in the through hole of a carrier board by electroplating and directly electrically connected to circuit layers on the first and second surfaces of the carrier board, thereby avoiding the use of an annular metal ring for electrically connecting the circuit layers as in the prior art. Thus, the present invention can increase circuit density and reduce spacing between adjacent conductive pillars of the carrier board.

Further, by forming a conductive pillar in the through hole of a carrier board, the present invention avoids the use of the filling material as in the prior art, thereby preventing the filling material from adversely affecting reliability and quality of the circuit board structure and reducing complexity of the fabricating process.

BRIEF DESCRIPTION OF DRAWINGS

FIG. 3A' is a sectional diagram showing a roughening process of the carrier board in fabricating the circuit board structure according to the present invention;

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be made without departing from the spirit of the present invention.

First Embodiment

FIGS. 3A to 3D are sectional diagrams showing a method for fabricating a circuit board structure according to a first embodiment of the present invention.

Figure 1A:
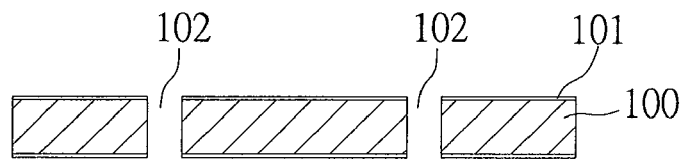
FIGS. 1A and 1D are sectional diagrams showing a method for fabricating a conventional core circuit board structure.
Figure 1B:
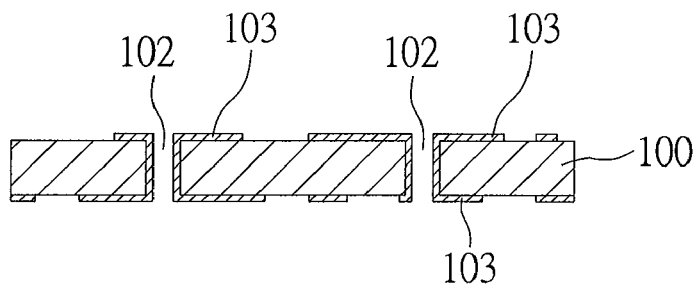
Figure 1C:
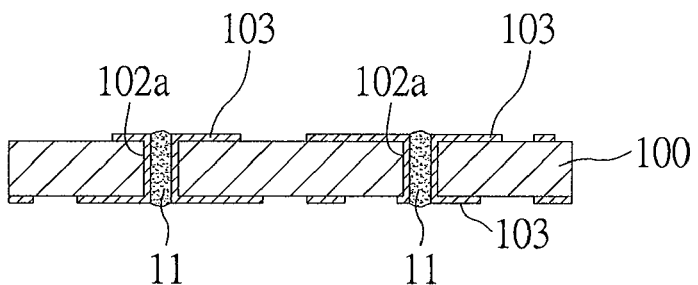
Figure 1D:
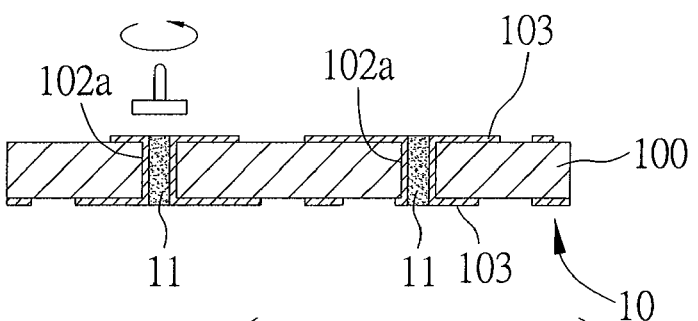
Figure 2:
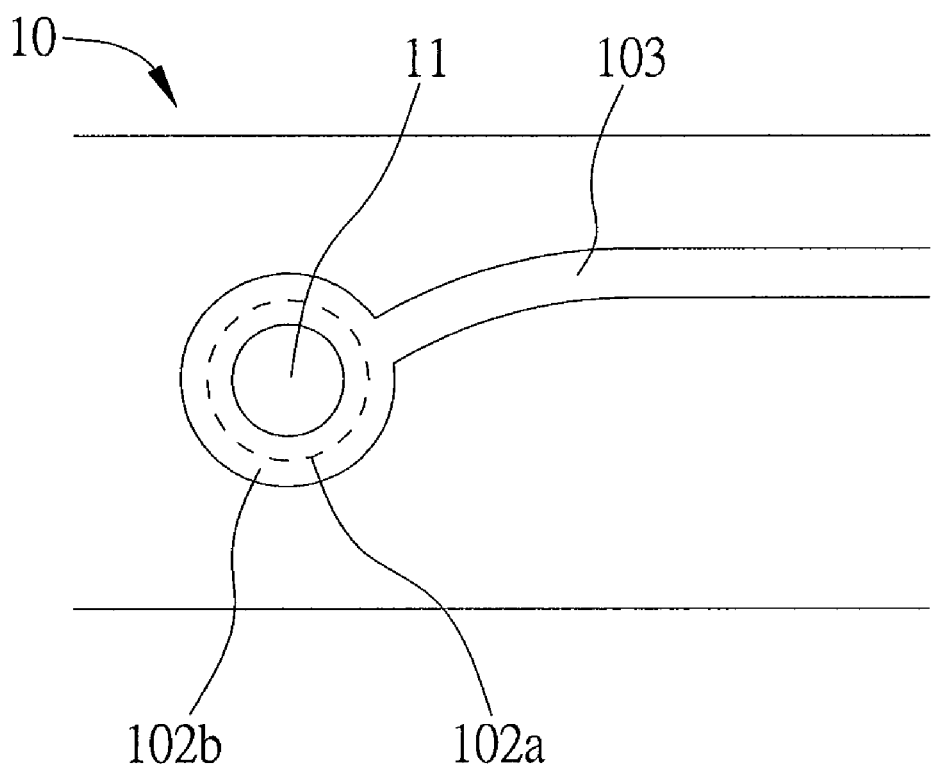
FIG. 2 is an upper view of a plated through hole and circuit connected to the plated through hole of FIG. 1D.
Figure 3A:
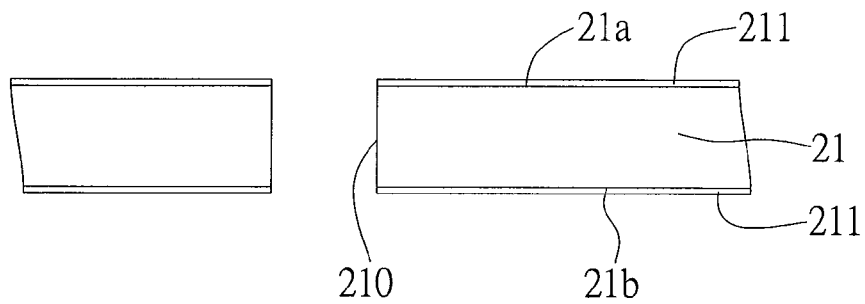
FIGS. 3A to 3D are sectional diagrams showing a method for fabricating a circuit board structure according to a first embodiment of the present invention.
Figure 3A:
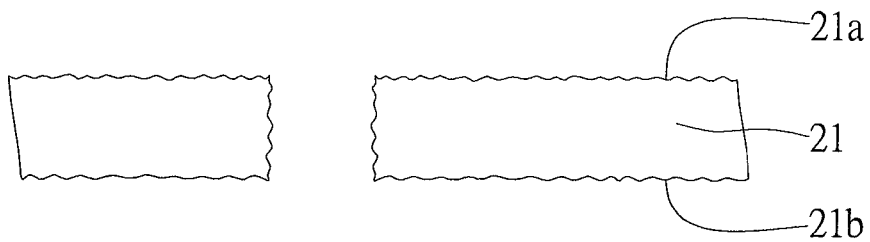

As shown in FIG. 3A, a carrier board 21 having a first surface 21a and a second surface 21b is provided. The carrier board 21 can be one of a dielectric board, a copper clad laminate, a double-layer circuit board and a multi-layer circuit board. The prevent invention exemplifies a carrier board 21 of copper clad laminate, but it is not limited thereto. The first surface 21a and the second surface 21b of the carrier board 21 are respectively disposed with copper foil 211. At least a through hole 210 is formed in the carrier board 21 and penetrating the first surface 21a and the second surface 21b.

Alternatively, as shown in FIG. 3A', a roughening process is performed to roughen the first surface 21a and the second surface 21b as well as surface of the through hole 210 of the carrier board 21 and meanwhile the copper foil 211 on the first surface 21a and the second surface 21b is removed. Since subsequent fabricating processes are similar to the present embodiment, detailed description of the fabricating processes is omitted herein, which, however, by no means limits the present invention.

Figure 3B:
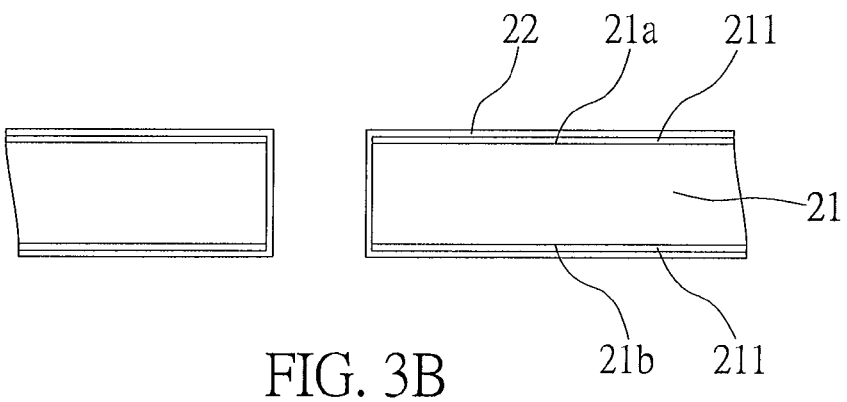

As shown in FIG. 3B, a conductive layer 22 is formed on the copper foil 211 of the first and second surfaces 21a, 21b of the carrier board 21 and surface of the through hole 210. The conductive layer 22 is mainly used as a current conductive path for a subsequent electroplating process. The conductive layer 22 can be made of a metal material or an alloy, or formed by depositing several metal layers. For example, the conductive layer 22 can be made of one of the group consisting of Cu, Sn, Ni, Cr, Ti, Cu—Cr alloy and Sn—Pb alloy. Alternatively, the conductive layer 22 can be made of a conductive polymer material such as polyacetylene, polyaniline, organosulfide polymer and so on.

Figure 3C:
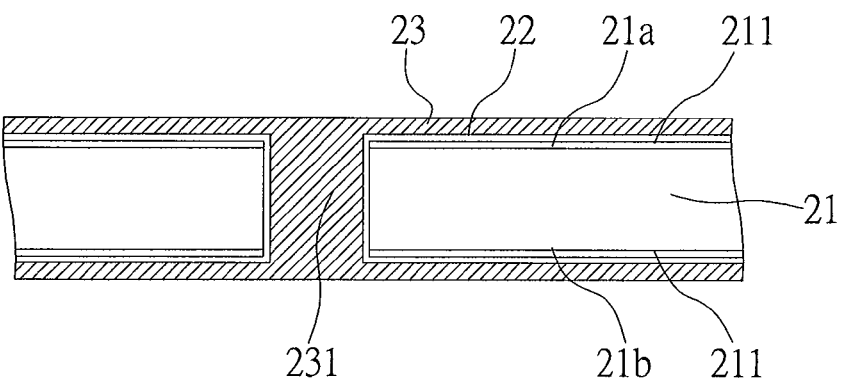

As shown in FIG. 3C, an electroplating process is performed on the carrier board 21 by using the conductive layer 22 as a current conductive path, thereby forming a metal layer 23 on the first surface 21a and the second surface 21b of the carrier board 21 and forming a conductive pillar 231 in the through hole 210. The metal layer 23 can be made of one of Pd, Pb, Sn, Ag, Cu, Au, Bi, Sb, Zn, Ni, Zr, Mg, In, Te and Ga. However, in practice, since the technique using copper as an electroplating material is well developed and has relatively low cost, the metal layer 23 is preferably made of copper, but it is not limited thereto.

Figure 3D:
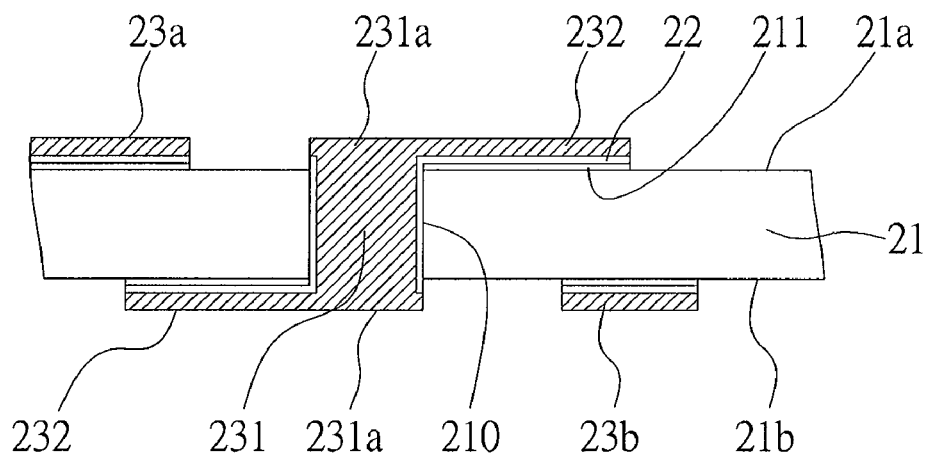
Figure 4:
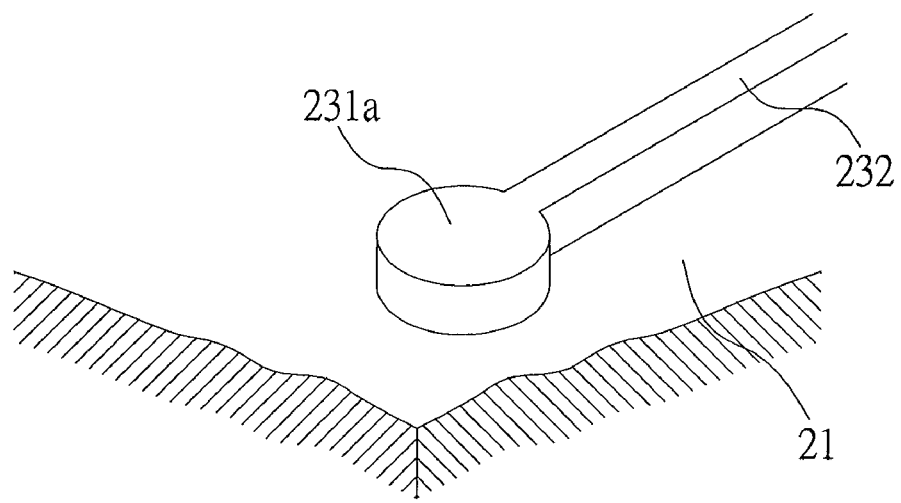
FIG. 4 is a solid diagram showing connection between the circuit and conductive pillar of the circuit board structure of FIG. 3D.

As shown in FIG. 3D, the first and second surfaces 21a, 21b of the carrier board 21 are patterned so as to remove part of the metal layer 23 on the first and second surfaces 21a, 21b of the carrier board 21 and also remove the conductive layer 22 and the copper foil 211 covered by the metal layer 23, thereby respectively forming a first circuit layer 23a and a second circuit layer 23b on the first surface 21a and the second surface 21b as well as a conductive pillar 231, wherein the conductive pillar 231 has end portions 231a protruding above the first and second surfaces 21a, 21b of the carrier board 21. Diameter of the end portions 231a is not greater than that of the through hole 210. The first and second circuit layers 23a, 23b respectively have at least a circuit 232 electrically connected to side peripheries of the end portions 231a of the conductive pillar 231, and width of the circuit 232 is not greater than diameter of the through hole 210. The connection between the circuit 232 and the conductive pillar 231 is shown in FIG. 4.

Subsequently, a circuit build-up process can be performed on the first and second circuit layers 23a, 23b according to practical electrical design requirements.

According to the above fabrication method, the present invention further discloses a circuit board structure, which comprises: a carrier board 21 having a first surface 21a and an opposed second surface 21b, the carrier board 21 having at least a through hole 210 penetrating the first and second surfaces 21a, 21b thereof; a conductive pillar 231 formed in the through hole 210 by electroplating and having end portions 231a protruding above the first and the second surfaces 21a, 21b of the carrier board 21, wherein diameter of the end portions 231a is not greater than that of the through hole 210; and first and second circuit layers 23a, 23b respectively formed on the first and second surfaces 21a, 21b of the carrier board 21 and respectively comprising circuit 232 electrically connected to side peripheries of the end portions 231a of the conductive pillar 231.

Second Embodiment

FIGS. 5A to 5E are sectional diagrams showing a method for fabricating a circuit board structure according to a second embodiment of the present invention. A main difference of the present embodiment from the first embodiment is the circuit of the first and second circuit layers on surfaces of the carrier board is electrically connected to top surface of the end portions of the conductive pillar.

Figure 5A:
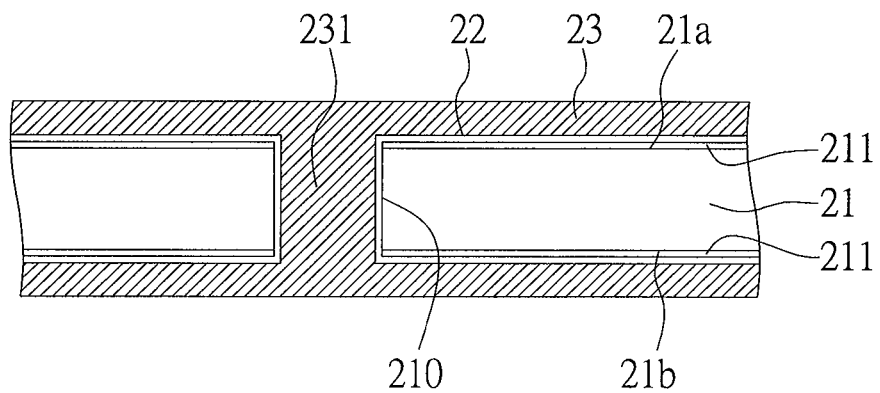
FIGS. 5A to 5E are sectional diagrams showing a method for fabricating a circuit board structure according to a second embodiment of the present invention.

As shown in FIG. 5A, as a continuation of the process of FIG. 3B in the first embodiment, a metal layer 23 is formed on the conductive layer 22 on the first and second surfaces 21a, 21b of the carrier board 21 and a conductive pillar 231 is formed in the through hole 210 of the carrier board 21 by electroplating.

Figure 5B:
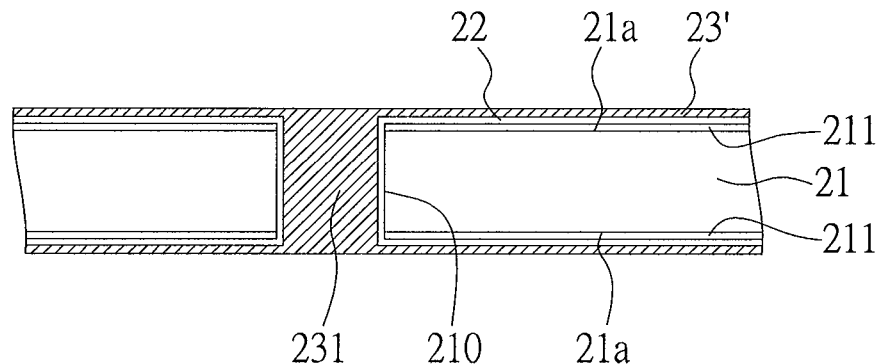

As shown in FIG. 5B, the metal layer 23 on the first and second surfaces 21a, 21b of the carrier board 21 is thinned so as to form a thin metal layer 23'.

Figure 5C:
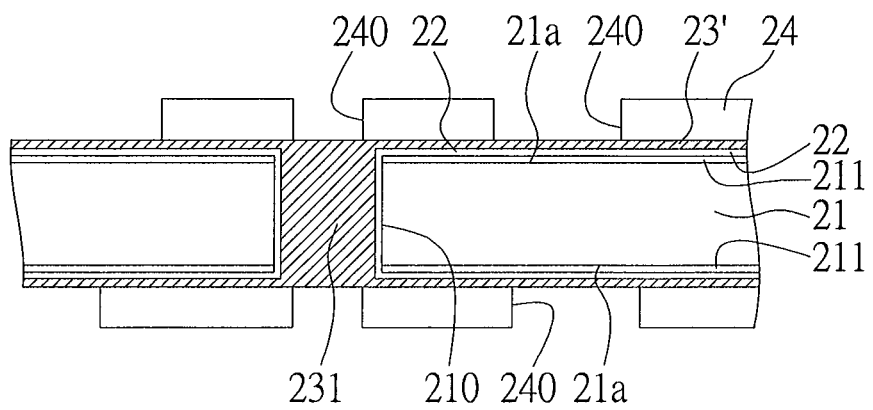

As shown in FIG. 5C, a resist layer 24 is formed on surface of the thin metal layer 23' and a plurality of openings 240 is formed in the resist layer 24 so as to expose part of the thin metal layer 23'. Openings 240 are also formed in the resist layer 24 at positions corresponding to the two ends of the conductive pillar 231. The resist layer 24 can be such as a dry film or liquid photoresist, which is formed on surface of the thin metal layer 23' by printing, spin coating or attaching.

Figure 5D:
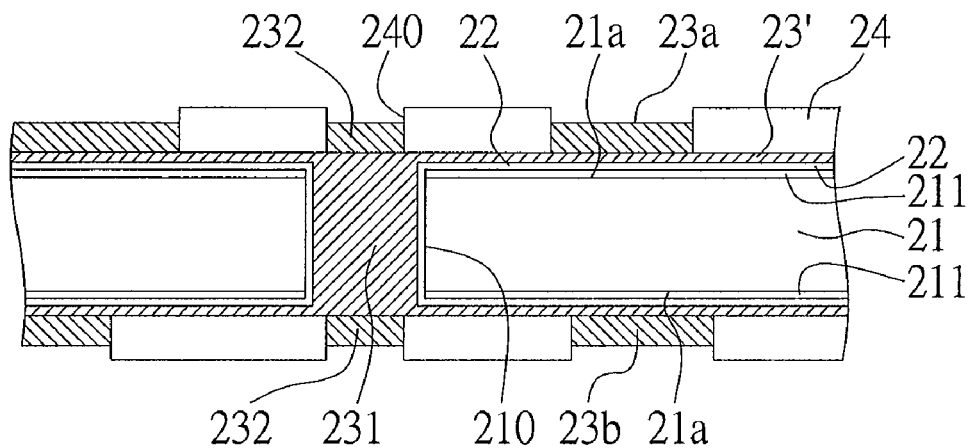

As shown in FIG. 5D, first and second circuit layers 23a, 23b are respectively formed in the openings 240 of the resist layer 24 on the first and second surfaces 21a, 21b of the carrier board 21, wherein the first and second circuit layers 23a, 23b respectively have at least a circuit 232 electrically connected to top surface of the two end portions 231a of the conductive pillar 231. Diameter of the end portions 231a is not greater than that of the through hole 210.

Figure 5E:
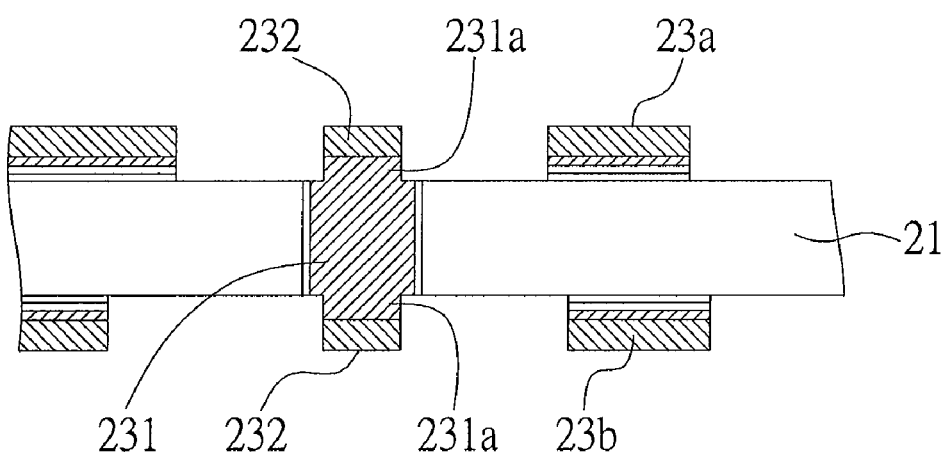
Figure 6:
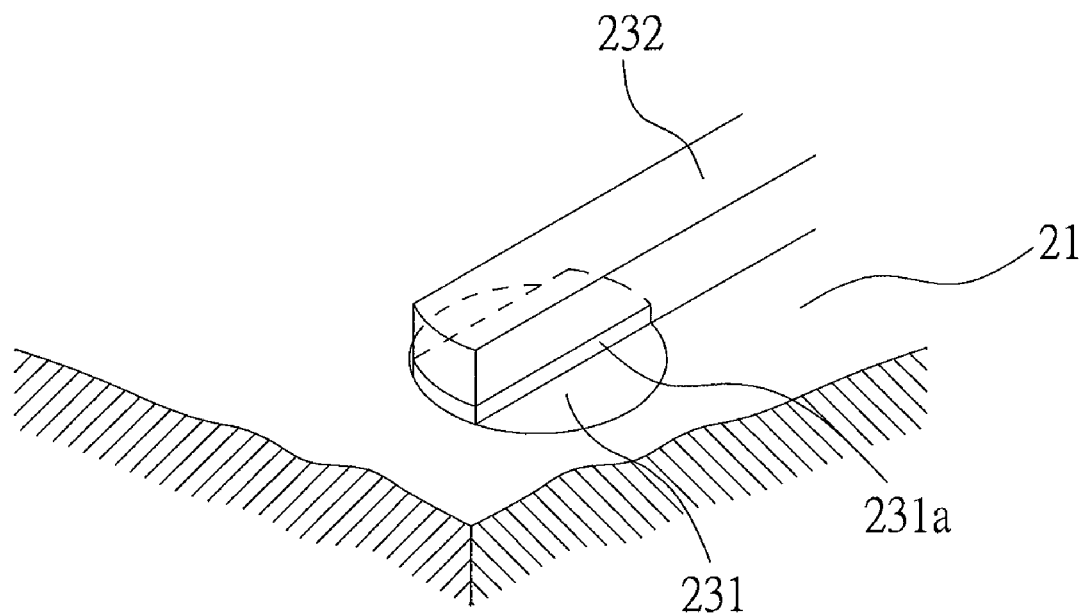
FIG. 6 is a solid diagram showing connection between the circuit and conductive pillar of the circuit board structure of FIG. 5E.

As shown in FIG. 5E, the resist layer 24, and the thin metal layer 23', the conductive layer 22 and the copper foil 211 covered by the resist layer 24 are removed, wherein the circuit 232 of the first and second circuit layers 23a, 23b is electrically connected to the top surface of the two end portions 231a of the conductive pillar 231 and width of the circuit 232 is not greater than diameter of the through hole 210. FIG. 6 shows the connection between the circuit 232 and the conductive pillar 231.

Thereafter, a circuit build-up process can be performed on the first and second surfaces 21a, 21b of the carrier board 21 to meet electrical design requirements.

Through the above fabrication method, the present invention further discloses another circuit board structure, which comprises: a carrier board 21 having a first surface 21a and a second surface 21b opposed to the first surface 21a, the carrier board 21 having at least a through hole 210 penetrating the first and second surfaces 21a, 21b; a conductive pillar 231 formed in the through hole 210 by electroplating and having end portions 231a protruding above the first and the second surfaces 21a, 21b of the carrier board 21, wherein diameter of the end portions 231a is not greater than that of the through hole 210; and first and second circuit layers 23a, 23b respectively formed on the first and second surfaces 21a, 21b of the carrier board 21 and respectively comprising circuit 232 electrically connected to top surface of the two end portions 231a of the conductive pillar 231.

Third Embodiment

FIGS. 7A to 7F are sectional diagrams showing a method for fabricating a circuit board structure according to a third embodiment of the present invention. Different from the first and second embodiments, the first and second circuit layers of the present embodiment are electrically connected to the two ends of the conductive pillar through a conductive layer.

Figure 7A:
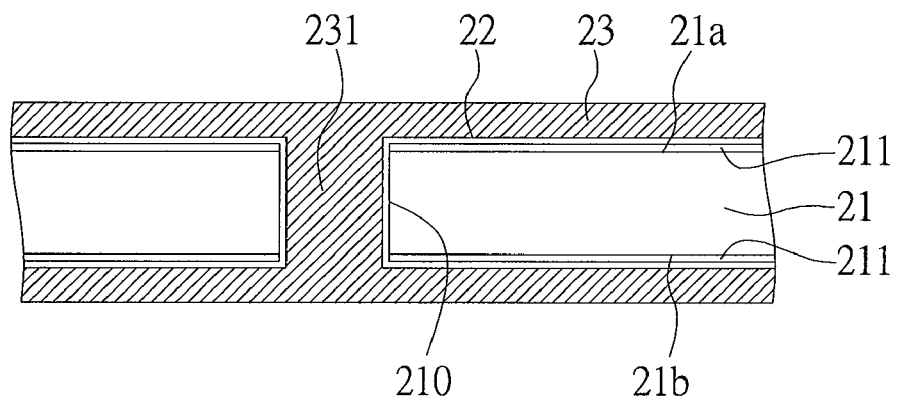
FIGS. 7A to 7F are sectional diagrams showing a method for fabricating a circuit board structure according to a third embodiment of the present invention.

As shown in FIG. 7A, as a continuation of the process of FIG. 3B, a metal layer 23 is formed on the conductive layer 22 on the first and second surfaces 21a, 21b of the carrier board 21 and a conductive pillar 231 is formed in the through hole 210 of the carrier board 21 by electroplating.

Figure 7B:
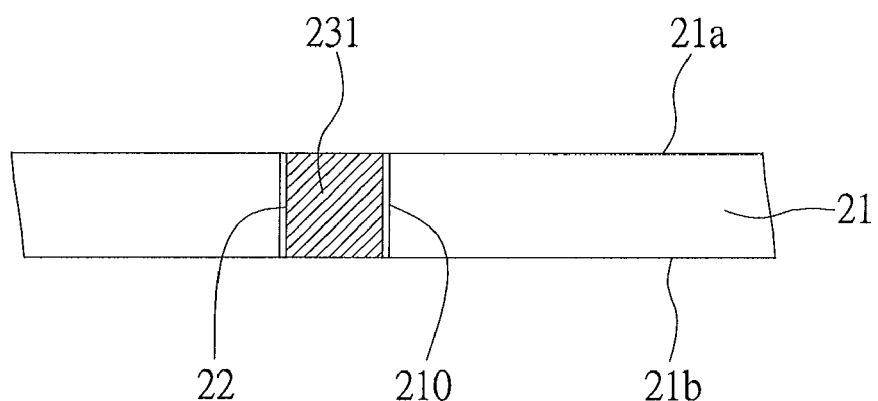

As shown in FIG. 7B, the metal layer 23, the conductive layer 22 and the copper foil 211 on the first and second surfaces 21a, 21b are removed.

Figure 7C:
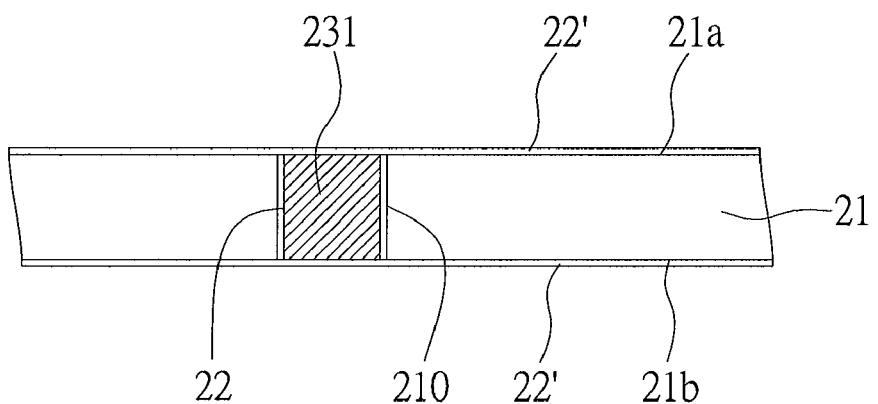

As shown in FIG. 7C, another conductive layer 22' is formed on the first surface 21a, the second surface 21b and the two ends of the conductive pillar 231 of the carrier board 21.

Figure 7D:
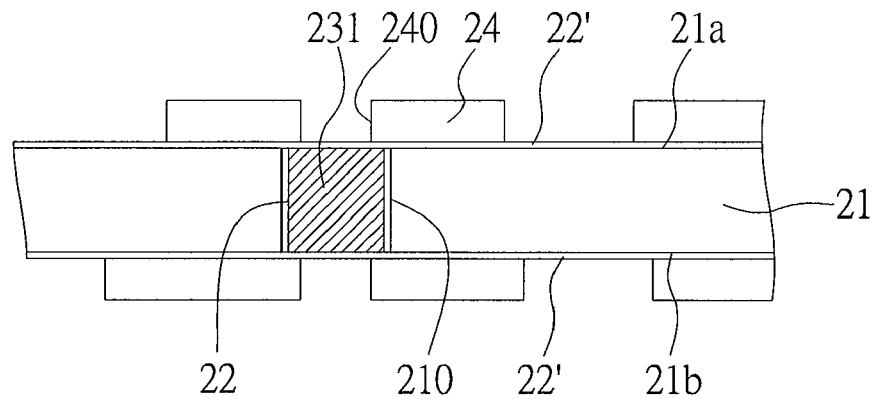

As shown in FIG. 7D, a resist layer 24 is formed on surface of the conductive layer 22' and a plurality of openings 240 is formed in the resist layer 24 so as to expose part of the conductive layer 22'. Openings 240 are also formed at positions corresponding to the two ends of the conductive pillar 231. The resist layer 24 can be such as a dry film or liquid photoresist, which is formed on the conductive layer 22' by printing, spin coating or attaching.

Figure 7E:
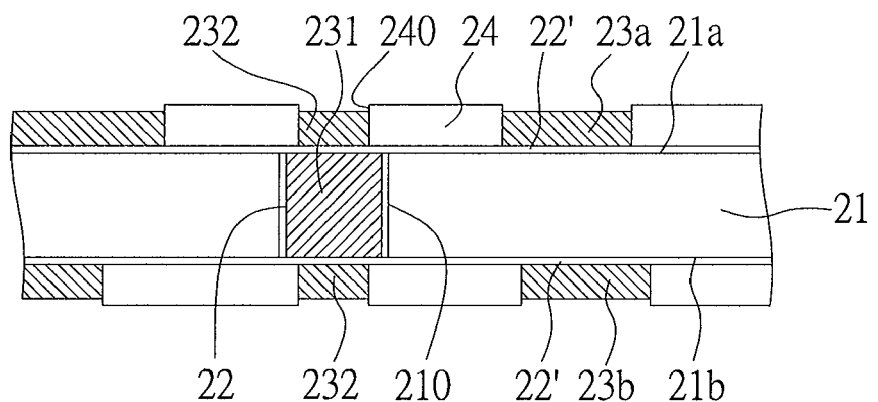

As shown in FIG. 7E, first and second circuit layers 23a, 23b are respectively formed in the openings 240 of the resist layer 24 on the first and second surfaces 21a, 21b of the carrier board 21, wherein the first and second circuit layers 23a, 23b respectively have at least a circuit 232 electrically connected to the conductive layer 22' on the two ends 231a of the conductive pillar 231.

Figure 7F:
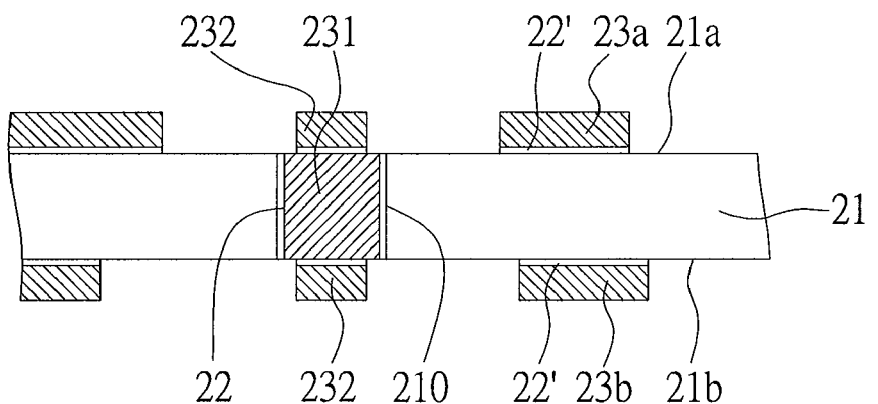
Figure 8:
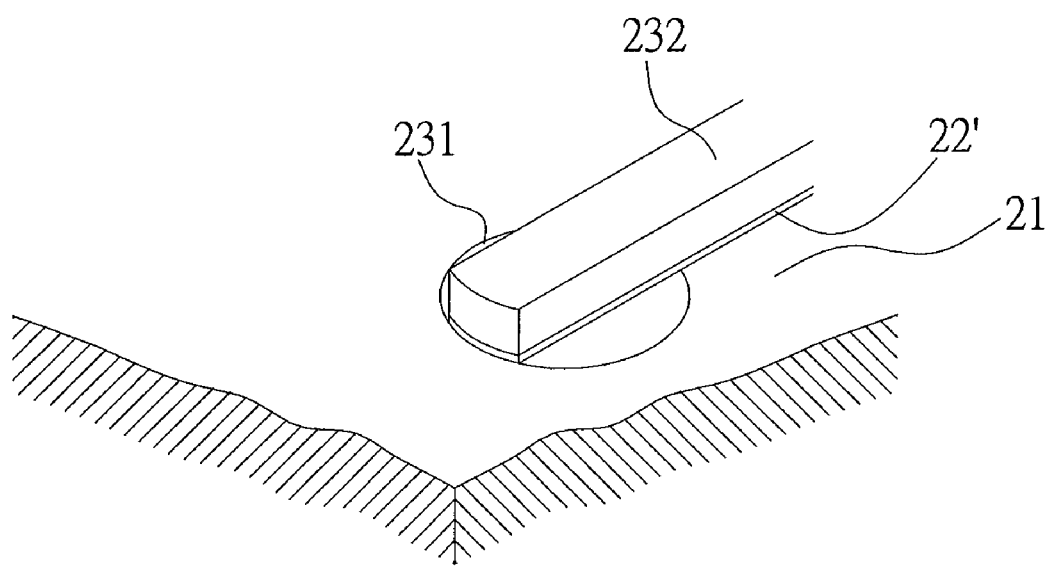
FIG. 8 is a solid diagram showing connection between the circuit and conductive pillar of the circuit board structure of FIG. 7F.

As shown in FIG. 7F, the resist layer 24 on the first and second surfaces 21a, 21b and the conductive layer 22' covered by the resist layer 24 are removed, wherein the circuit 232 of the first and second circuit layers 23a, 23b are electrically connected to the conductive layer on the two ends of the conductive pillar 231 and width of the circuit 232 is not greater than diameter of the through hole 210. FIG. 8 shows the connection between the circuit 232 and the conductive pillar 231. Thereafter, a circuit build-up process can be performed on the first and second surfaces 21a, 21b of the carrier board 21 to meet electrical design requirements.

Therefore, according to the present invention, a conductive pillar is formed in the through hole of a carrier board by electroplating and directly electrically connected to circuit layers on the first and second surfaces of the carrier board. Compared with the prior art that uses an annular metal ring to electrically connect the circuit layers, the present invention can increase circuit layout area of the carrier board and decrease spacing between adjacent conductive pillars of the carrier board, thereby increasing the circuit layout density.

Further, by forming a conductive pillar in the through hole of a carrier board, the present invention avoids the use of the filling material as in the prior art, thereby preventing the filling material from adversely affecting reliability and quality of the circuit board structure and reducing complexity of the fabricating process.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A method for fabricating a circuit board structure, comprising:
  providing a carrier board having a first surface and a second surface opposed to the first surface, the carrier board having at least a through hole penetrating the first and second surfaces;
  forming a conductive pillar in the through hole of the carrier board by electroplating and forming a metal layer on the first and second surfaces by electroplating; and
  patterning the metal layer so as to respectively form a first circuit layer and a second circuit layer on the first surface and the second surface of the carrier board and form end portions of the conductive pillar protruding above the first and second surfaces of the carrier board without the end portions of the conductive pillar covering the first and second surfaces, wherein diameter of the end portions of the conductive pillar is not greater than that of the through hole, and the first and second circuit layers are electrically connected to side peripheries of the end portions of the conductive pillar;
  wherein width of the circuit of the first and second circuit layers electrically connected to the conductive pillar is not greater than diameter of the through hole.

2. The method of claim 1, wherein the carrier board is one of a dielectric board, a copper clad laminate, a double-layer circuit board and a multi-layer circuit board.

3. The method of claim 1, wherein the method for fabricating the conductive pillar and the metal layer comprises:
  forming a conductive layer on the first and second surfaces of the carrier board and on surface of the through hole; and
  forming the conductive pillar and the metal layer on surface of the conductive layer by electroplating.

4. A method for fabricating a circuit board structure, comprising:
  providing a carrier board having a first surface and a second surface opposed to the first surface, the carrier board having at least a through hole penetrating the first and second surfaces;
  forming a conductive pillar in the through hole of the carrier board by electroplating and forming a metal layer on the first and second surfaces by electroplating;
  thinning the metal layer so as to form a thin metal layer;
  forming a resist layer on surface of the thin metal layer and forming a plurality of openings in the resist layer so as to expose the thin metal layer, wherein portion of the openings being formed at position corresponding to the two ends of the conductive pillar;

respectively forming a first circuit layer and a second circuit layer in the openings of the resist layer on the first and second surfaces of the carrier board by electroplating; and removing the resist layer and the thin metal layer covered by the resist layer so as to form end portions of the conductive pillar protruding above the first and second surfaces of the carrier board without the end portions of the conductive pillar covering the first and second surfaces, and electrically connect the first and second circuit layers to top surface of the end portions of the conductive pillar;

wherein diameter of the end portions of the conductive pillar is smaller than that of the through hole.

5. The method of claim 4, wherein the carrier board is one of a dielectric board, a copper clad laminate, a double-layer circuit board and a multi-layer circuit board.

6. The method of claim 4, wherein the method for fabricating the conductive pillar and the metal layer comprises:

forming a conductive layer on the first and second surfaces of the carrier board and surface of the through hole; and forming the conductive pillar and the metal layer on surface of the conductive layer by electroplating.

7. The method of claim 6, wherein removing the resist layer further comprises removing the conductive layer covered by the thin metal layer.

8. A method for fabricating a circuit board structure, comprising:

providing a carrier board having a first surface and a second surface opposed to the first surface, the carrier board having at least a through hole penetrating the first and second surfaces;

forming a conductive pillar in the through hole of the carrier board by electroplating and forming a metal layer on the first and second surfaces by electroplating;

removing the metal layer on the first and second surfaces;

forming a conductive layer on the first and second surfaces of the carrier board and two ends of the conductive pillar;

forming a resist layer on the conductive layer and forming a plurality of openings in the resist layer so as to expose the conductive layer, wherein portion of the openings are formed at position corresponding to the two ends of the conductive pillar;

respectively electroplating a first circuit layer and a second circuit layer in the openings of the resist layer on the first and second surfaces of the carrier board, the first and second circuit layers electrically connected to the conductive layer on the two ends of the conductive pillar; and removing the resist layer and the conductive layer covered by the resist layer;

wherein width of the circuit of the first and second circuit layers electrically connected to the conductive pillar is smaller than diameter of the through hole, and each of the first and second circuit layers has the same pattern as the conductive layer.

9. The method of claim 8, wherein the carrier board is one of a dielectric board, a copper clad laminate, a double-layer circuit board and a multi-layer circuit board.

10. The method of claim 8, wherein the method for fabricating the conductive pillar and the metal layer comprises:

forming a conductive layer on the first and second surfaces of the carrier board and surface of the through hole; and forming the conductive pillar and the metal layer on surface of the conductive layer by electroplating.

11. The method of claim 10, further comprising removing the metal layer and the conductive layer covered by the metal layer.

* * * * *